(12) United States Patent
Ghanem

(10) Patent No.: US 6,400,102 B1
(45) Date of Patent: Jun. 4, 2002

(54) NON-LINEAR LIGHT-EMITTING LOAD CURRENT CONTROL

(75) Inventor: Mohamed Sherif Ghanem, Pierrefonds (CA)

(73) Assignee: Gelcore, LLC, Valley View, OH (US)

( * ) Notice: Subject to any disclaimer, the term of this patent is extended or adjusted under 35 U.S.C. 154(b) by 0 days.

(21) Appl. No.: 09/875,027

(22) Filed: Jun. 7, 2001

Related U.S. Application Data

(62) Division of application No. 09/471,372, filed on Dec. 23, 1999.

(51) Int. Cl.[7] .................................................. G05F 1/00
(52) U.S. Cl. ....................... 315/291; 315/224; 315/311; 307/60
(58) Field of Search ................................. 315/291, 224, 315/247, 311, 209 R, 219, 272, 307; 307/52, 60; 363/20, 21, 89

(56) References Cited

U.S. PATENT DOCUMENTS

| | | | |
|---|---|---|---|
| 4,291,280 A | 9/1981 | Gardner | 331/65 |
| 4,329,625 A | 5/1982 | Nishizawa et al. | 315/311 |
| 4,523,265 A | 6/1985 | Deprez | 363/21 |
| 4,639,611 A | 1/1987 | Sticher | 307/117 |
| 5,013,971 A | 5/1991 | De La Chapelle | 315/291 |
| 5,036,254 A | * 7/1991 | Shimizu | 315/219 |
| 5,323,305 A | 6/1994 | Ikeda et al. | 315/291 |
| 6,127,784 A | * 10/2000 | Grossman et al. | 315/307 |

* cited by examiner

*Primary Examiner*—Don Wong
*Assistant Examiner*—Thuy Vinh Tran
(74) *Attorney, Agent, or Firm*—Birch, Stewart, Kolasch & Birch

(57) ABSTRACT

A sensor circuit detects a current supplied to a set of light-emitting diodes and produces a current reading dependent on the temperature of .operation of these light-emitting diodes. The sensor circuit comprises first and second serially interconnected resistors also connected in series with the set of light-emitting diodes. The sensor circuit also comprises a temperature-dependent impedance connected in parallel with one of the first and second resistors. At least a portion of the current through the set of light-emitting diodes flows through the sensor circuit to enable the first and second serially interconnected resistors and the temperature-dependent impedance to produce a variable voltage signal representative of the current through the set of light-emitting diodes, this variable voltage signal being dependent upon temperature. The above sensor circuit finds application in a substantially constant intensity light source.

2 Claims, 3 Drawing Sheets

NON-LINEAR LIGHT-EMITTING LOAD CURRENT CONTROL

RELATED PATENT APPLICATION

This patent application is a divisional application of application Ser. No. 09/471,372, filed Dec. 23, 1999, for an invention titled "NON-LINEAR LIGHT-EMITTING LOAD CURRENT CONTROL".

BACKGROUND OF THE INVENTION

1. Field of the Invention

The present invention relates to a temperature-dependent current sensor circuit and a substantially constant intensity light source and corresponding method using this sensor circuit.

2. Brief Description of the Prior Art

Insertion of an integrated power factor controller circuit such as controller MC33262 from MOTOROLA in an electric power supply system enables easy and efficient control of the power factor and the level of current harmonics.

To obtain a power factor equal to unity, controller MC33262 draws current from the ac source in proportion to the sinusoidal voltage. This concept automatically causes the current waveform to be sinusoidal and in phase with the voltage waveform.

Also, operation of power factor controller MC33262 requires that the output supply voltage be higher than the peak amplitude of the input sinusoidal voltage in order to draw current from the ac source throughout every cycle of the sinusoid. Accordingly, the output supply voltage must have an amplitude higher than the peak amplitude of the sinusoidal voltage of the ac source.

In certain circumstances, an output supply voltage with an amplitude lower than the peak amplitude of the input ac voltage is required. In such cases, power factor controller MC33262 is used as a power-factor-correcting pre-converter; a second power converter is also required to reduce the level of the supply voltage to the desired amplitude.

Necessarily, providing a second power converter involves additional costs and requires more space.

Furthermore, the voltage/current characteristic of a light-emitting diode is sensitive to temperature causing the current through a light-emitting diode to change very rapidly and non-linearly with the voltage across the light-emitting diode.

For example, for a given type of light-emitting diode widely used in the fabrication of traffic signal lights, a constant voltage of 1.8 volts will produce in the light-emitting diode a current of about 7.5 mA at a temperature of −25° C., a current of about 20.5 mA at a temperature of +25° C., and a current of about 30 mA at a temperature of +60° C. The magnitude of the current through the light-emitting diode at a temperature of +60° C. is therefore, for a constant voltage of 1.8 volt, about 1.6 times higher than the magnitude of the current at a temperature of +25° C. Voltage feedback control would therefore be very detrimental to the service life of such a light-emitting diode.

Since voltage feedback control of the supply of a light-emitting diode is not desirable, current feedback control is required to ensure durability of the light-emitting diode.

Also, a fixed LED output current presents the following drawbacks:

at higher temperature the output LED power decrease; and at lower temperature the output LED power increases.

OBJECTS OF THE INVENTION

An object of the present invention is therefore to eliminate the above discussed drawbacks of the prior art.

Another object of the present invention is to regulate the output power, hence the light intensity, of a non-linear light-emitting load.

SUMMARY OF THE INVENTION

More specifically, in accordance with the present invention, there is provided a sensor circuit for detecting a current supplied to a non-linear load and for producing a current reading dependent on a condition of operation of the non-linear load. The sensor circuit comprises first and second serially interconnected resistors also connected in series with the non-linear load, and a variable impedance connected in parallel with one of the first and second resistors, the impedance varying with the condition of operation of the non-linear load. At least a portion of the current through the non-linear load flows through the sensor circuit to enable the first and second serially interconnected resistors and the variable impedance to produce a variable voltage signal representative of the current through the non-linear load and dependent on the condition of operation. In a preferred embodiment of the invention, the non-linear load is a light-emitting diode (LED) or a plurality of LEDs, and the condition of operation of the LED is temperature.

The invention described above therefore procures the advantage of providing a current-representative signal that may be used for feedback control of a non-linear load. Current feedback control is difficult with current sensor circuits which do not provide an output that varies with the condition of operation of the non-linear load. The invention described herein provides this feature in a simple low-cost circuit.

The present invention also relates to a substantially constant intensity light source comprising:

a) a non-linear light-emitting load;

b) a controllable dc voltage and current source for supplying the non-linear light-emitting load with dc voltage and current;

c) a current sensor circuit connected in series with the non-linear light-emitting load and the controllable dc voltage and current source, the current sensor circuit having an impedance varying with a condition of operation of the light-emitting load and being supplied with at least a portion of the current through the non-linear light-emitting load, whereby the variable impedance produces a variable current-representative signal; and d) a voltage and current control feedback circuit connected between the current sensor circuit and said controllable dc voltage and current source for controlling the dc voltage and current source in relation to the variable current-representative signal to thereby adjust the dc voltage and current to amplitudes that keep the light intensity produced by the light source substantially constant.

Further in accordance with the present invention, there is provided a substantially constant intensity light source comprising:

a) a controllable dc voltage and current source having first and second terminals;

b) a non-linear light-emitting load connected between the first and second terminals and supplied with dc voltage and current from the controllable dc voltage and current source;

c) a current sensor circuit connected in series with the non-linear light-emitting load between the first and second terminals, the current sensor circuit having an impedance varying with a condition of operation of the light-emitting load and being supplied with at least a portion of the current through the non-linear light-emitting load, whereby the variable impedance produces a variable current-representative signal, and d) a voltage and current control feedback circuit connected between the current sensor circuit and the controllable dc voltage and current source and through which the dc voltage and current source is controlled in relation to the variable current-representative signal to adjust the do voltage and current to amplitudes that keep the light intensity produced by the light source substantially constant.

The present invention still further relates to a method for keeping the intensity of a light source substantially constant, comprising:

a) supplying from a controllable dc voltage and current source a dc voltage and current to a non-linear light-emitting load:

b) supplying at least a portion of the current through the non-linear light-emitting load to a current sensor circuit having an impedance varying with a condition of operation of the light-emitting load, whereby the variable impedance produces a variable current-representative signal, and c) feedback controlling the dc voltage and current in relation to the variable current-representative signal to adjust the dc voltage and current to amplitudes that keep the light intensity produced by the light source substantially constant.

The objects, advantages and other features of the present invention will become more apparent upon reading of the following non-restrictive description of a preferred embodiment thereof, given by way of example only with reference to the accompanying drawings.

DETAILED DESCRIPTION OF THE PREFERRED EMBODIMENT

Although the preferred embodiment of the present invention will be described hereinafter with reference to an application of the current sensor circuit according to the invention to a light-emitting-diode lamp, it should be understood that this example is not intended to limit the range of applications of the present invention.

Figure 1:
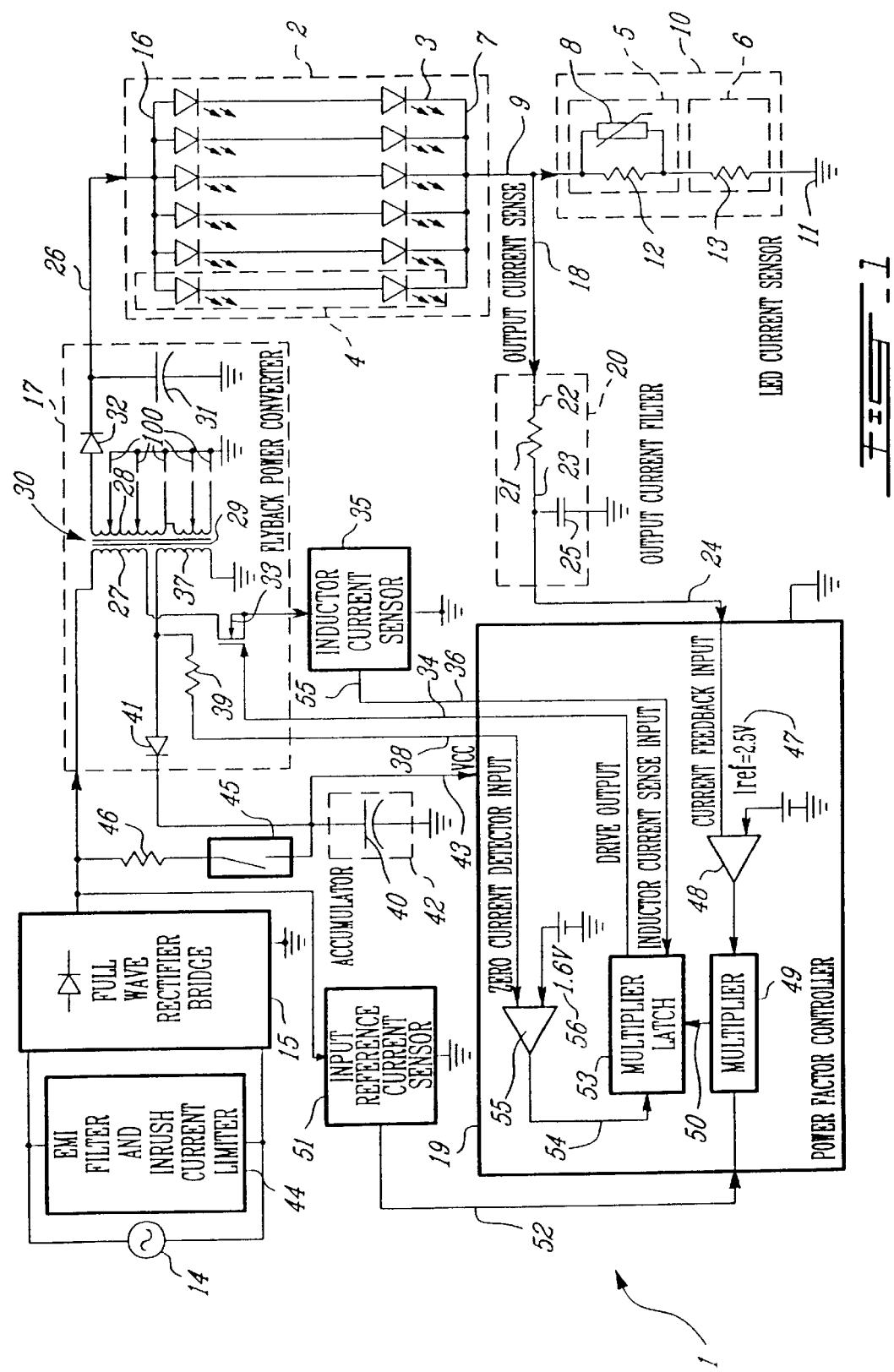
FIG. 1 is a schematic block diagram of the electronic circuit of a light-emitting-diode lamp Incorporating the current sensor circuit and a power supply system according to the invention.

Referring to FIG. 1 of the appended drawings, the LED lamp is generally identified by the reference 1. Lamp 1 comprises a set 2 of light-emitting diodes such as 3. The set 2 is formed of a plurality of subsets such as 4 of serially Interconnected light-emitting diodes 3. The subsets 4 of serially interconnected light-emitting diodes 3 are connected in parallel to form the set 2.

The cathode 7 of the last light-emitting diode 3 of each subset 4 is connected to a first terminal 9 of the current sensor circuit 10. Current sensor circuit 10 has a terminal 11 connected to ground.

The set 2 of light-emitting diodes 3 is supplied by an ac source 14. The alternating voltage and current from the ac source 14 is rectified by a full-wave rectifier bridge 15 and supplied to the anode 16 of the first diode 3 of each subset 4 through a power converter 17. To further smoothen the current waveform, an EMI (ElectroMagnetic Interference) filter and inrush current limiter 44 can be added between the ac source 14 and the full-wave rectifier bridge 15.

The current flowing through each subset 4 of light-emitting diodes 3 has a value limited by the impedance of current sensor circuit 10. Also, the current flowing in all the subsets 4 of light-emitting diodes 3 flows through impedances 5 and 6 of the current sensor circuit 10 serially interconnected between the terminals 9 and 11 to convert the total current flowing through the set 2 of light-emitting diodes 3 to a corresponding current-representative voltage signal present on an output 18 of current sensor circuit 10.

In the illustrated example, the controller 19 is the power factor controller manufactured and commercialized by Motorola and identified by the reference MC33262.

To enable the controller 19 to perform variable current feedback control on the set 2 of non-linear light-emitting diodes 3, the current sensor circuit 10 is connected to the input 24 of the power factor controller 19 through the filter circuit 20. The function of the current sensor circuit 10 is to transform the non-linear relation (LED current/voltage relation with temperature) between the LED supply dc voltage at the output 26 of the power converter 17 and the dc current supplied to the set 2 of light-emitting diodes 3 with temperature into a linear relation.

Figure 2:
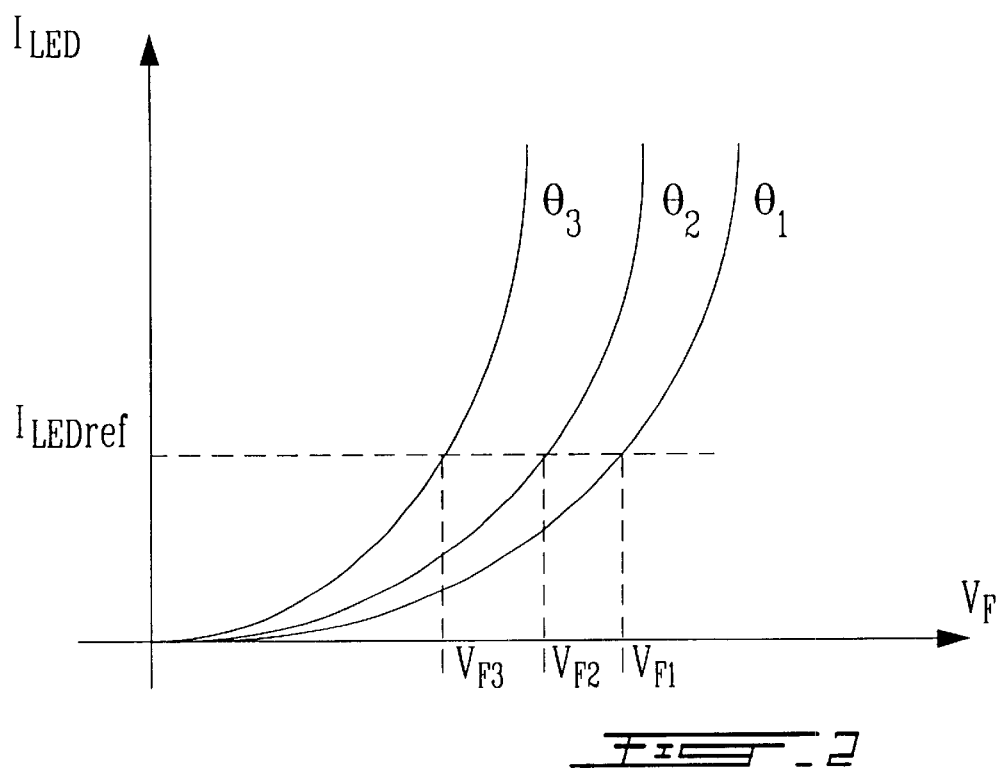
FIG. 2 is a graph showing a LED current as a function of LED voltage at different temperatures without load current control.

Referring to FIG. 2, LED current ($I_{LED}$) measurements at various temperatures are shown with respect to LED voltage when no current sensor circuit according to the present invention is used.

In FIG. 2, temperature $\theta_1$ is smaller than temperature $\theta_2$, which is itself smaller than temperature $\theta_3$. Note that at a reference LED current ($I_{LEDref}$), LED voltage $V_{F1}$ is greater than LED voltage $V_{F2}$, which is itself greater than LED voltage $V_{F3}$.

Figure 3:
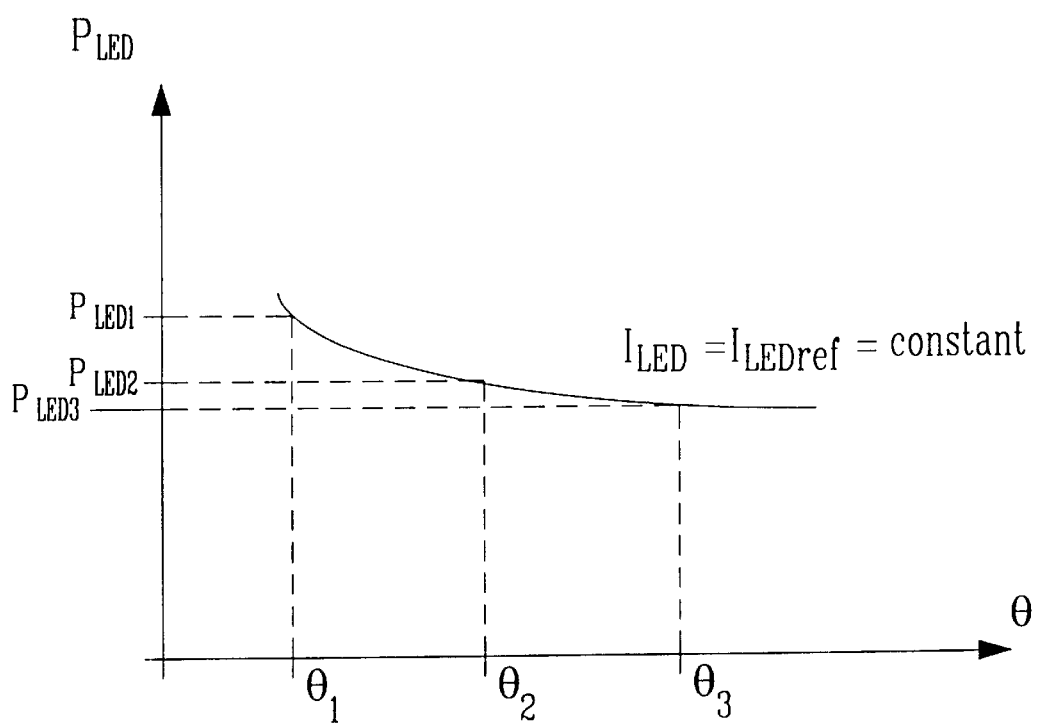
FIG. 3 is a graph showing LED output power as a function of temperature without load current control.

At a fixed current ($I_{LEDref}$), the output power ($P_{LED}$) as a function of temperature θ is given in FIG. 3.

The output LED power $P_{LED}$ is defined by:

$$P_{LED} = V_F \times I_{LEDref}.$$

FIG. 3 shows that, without the current sensor circuit of this invention, at a lower temperature ($\theta_1$), the LED output power $P_{LED1}$ is higher and, at the higher temperature ($\theta_3$), the LED output power $P_{LED3}$ is lower
That is:

$$P_{LED1} > P_{LED2} > P_{LED3}.$$

Figure 4:
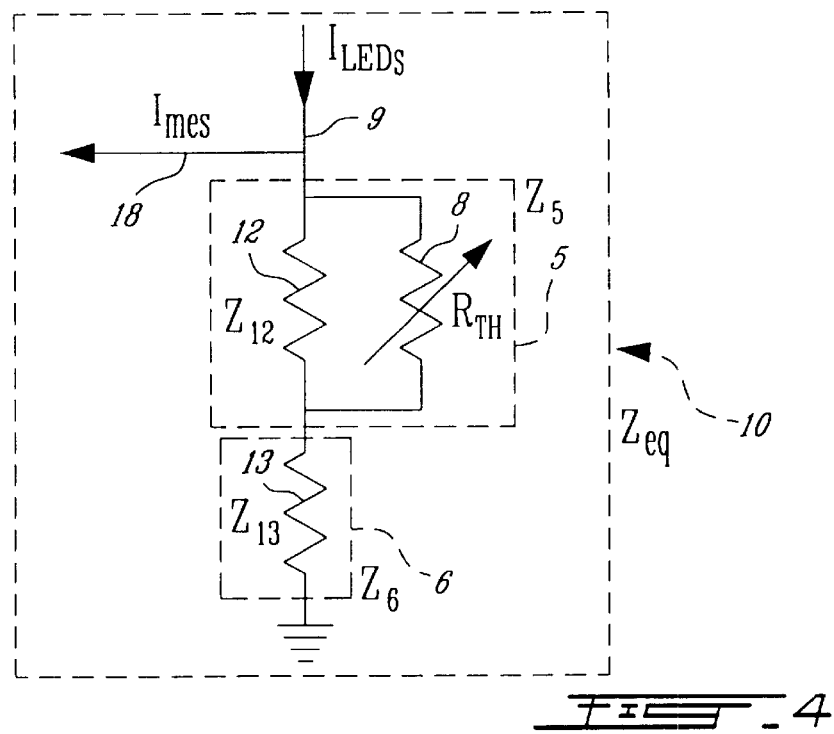
FIG. 4 is a block diagram of the load current sensor circuit according to the invention.

In order to avoid variations in the LED output power $P_{LED}$ with temperature θ at a fixed current, current sensor circuit 10 of FIG. 4 is introduced.

As shown in FIG. 4, the current sensor circuit 10 comprises the temperature dependent variable equivalent impedance $Z_{eq}$, which includes two impedances in series $Z_6$ and $Z_6$. $Z_5$ comprises a fixed resistor $R_{12}$, (12) in parallel with thermistor $R_{TH}$ (8). Both $R_{12}$ and $R_{TH}$ are in series with impedance $Z_6$ which can be implemented as a fixed resistor $R_{13}$ (13). The temperature dependent variable equivalent impedance $Z_{eq}$ is given by:

$$Z_{eq}(\theta) = Z_5 + Z_6 = \frac{R_{12} * R_{TH}(\theta)}{R_{12} + R_{TH}(\theta)} + R_{13}$$

The current-representative voltage signal $I_{mes}$ is given by the product of LED current $I_{LED}$ (9) and a variable equivalent impedance $Z_{eq}$ (θ) (10); where $Z_{eq}$ is formed of passive elements and is a non-linear impedance dependent on the casing of the LED lamp, the power supply, the LEDs and surrounding temperature θ.

$$I_{mes} = Z_{eq}(\theta) * I_{LED}$$

The current-representative voltage signal $I_{mes}$ has an amplitude that is proportional to the magnitude of the current flowing through current sensor circuit 10 ($Z_{eq}$). This circuit enables regulation of the dc current supplied to the LEDs as a function of temperature θ.

When the temperature θ is constant, the current sensor circuit 10 impedance value $Z_{eq}$ is constant and the LEDs are driven by a constant current.

Figure 5:
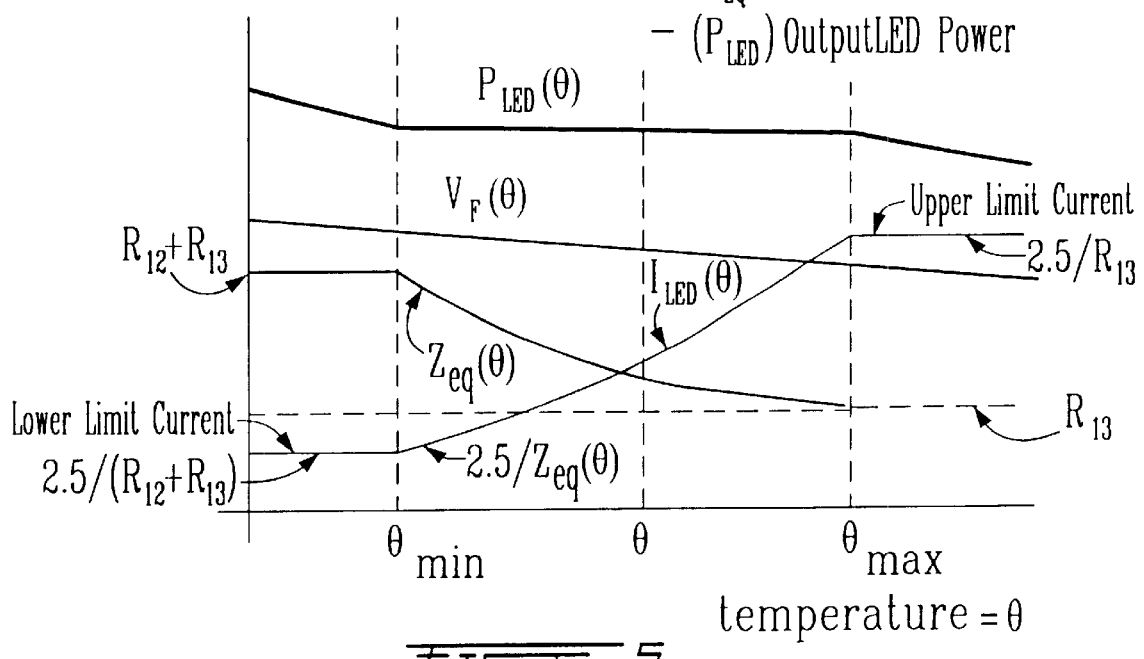
FIG. 5 is a graph showing LED current, LED voltage, equivalent impedance and LED output power as a function of temperature with load current control according to the invention.

Referring to FIG. 5, when the temperature θ rises to the maximum temperature $\theta_{max}$, the value of the thermistor $R_{TH}$ decreases such that:

$$Z_5 \cong R_{TH_{min}}$$

The equivalent sensor impedance value $Z_{eq}$ (θ) diminishes until it reaches $Z_{eq_{min}}$, where $$Z_{eq_{min}} \cong R_{TH_{min}} + R_{13}$$

and the maximum current on the LEDs is:

$$I_{LED_{max}} \simeq \frac{I_{ref}}{Z_{eq_{min}}} \simeq \frac{I_{ref}}{R_{TH_{min}} + R_{13}}$$

where $I_{ref}$ is a voltage providing a fixed LED current reference.

As a result $I_{mes}$ diminishes and the difference E between fixed reference current $I_{ref}$ (47) and filtered LEDs current measure $I_{mes}$ (24) increases, so that the LED current is increased by the power supply until the difference $E = I_{ref} - I_{mes}$ equals zero.

The maximum current on the LEDs is therefore limited by the choice of $R_{13}$ (13) of current sensor circuit (10). This in turn maintains a roughly constant power output from the LEDs.

Conversely, if the temperature drops until the minimum temperature θmin, the value of resistor $R_{TM}$ increases such that:

$$Z_5 \cong R_{12}$$

and the equivalent sensor impedance value $Z_{eq}$ (θ) rises until:

$$Z_{eq_{max}} \cong R_{12} + R_{13}$$

and the minimum current on the LEDs is:

$$I_{LED_{min}} \simeq \frac{I_{ref}}{Z_{eq_{max}}} \simeq \frac{I_{ref}}{R_{12} + R_{13}}$$

As a result $I_{mes}$ increases and the difference E decreases so that the power supply decreases the current in the LEDs until the difference E is again equal to zero.

Hence, the upper limit for current to the LEDs is limited by $R_{13}$, (i.e., $R_{TH}$ minimum at higher temperature), while the lower current limit is determined by ($R_{12}+R_{13}$), (i.e., $R_{TH}$ maximum at lower temperature).

As explained above this LED lamp output regulation is based on variation of current measurement with temperature as shown in FIG. 5.

Referring back to FIG. 1, the filter circuit 20 comprises a resistor 21 connected between output 18 of the current sensor circuit 10 and input 24 of the controller 19, and a capacitor 25 connected between terminal 23 of the resistor 21 and the ground.

The values of the resistor 21 and capacitor 25 also contribute to transform the non linear relation between the LED supply dc voltage at the output 26 of the power converter 17 and the dc current supplied to the set 2 of light-emitting diodes 3 into a linear relation. The values of the resistor 21 and capacitor 25 must therefore be precisely and carefully adjusted in relation to the current characteristic of the voltage/current characteristic of the type of diodes 3 being used.

To current feedback control the supply of the set 2 of light-emitting diodes 3, the controller 19 requires on its input 24 a current-representative voltage feedback signal which varies linearly with the LED supply dc voltage at the output 26 of the power converter 17. The current-representative voltage feedback signal on input 24 will be compared to $I_{ref}$(47) in comparator 48. The output of comparator 48 is a high/low difference-representative signal fed to multiplier 49. Multiplier 49 also has as an input a reference control voltage from output 52 of an input reference current sensor 51. Multiplier 49 adjusts its gain according to its inputs and produces a corresponding current reference waveform signal 50. The multiplier output 50 controls the inductor current sensor 35 threshold as the ac voltage traverses sinusoidally from zero to peak line voltage. This has the effect of forcing the MOSFET 33 "on time" to track the input line voltage, resulting in a fixed drive output "on time", thus making the preconverter load (17 plus 4) appear to be resistive to the ac line. Controller 19 also receives on input 38 (zero current detector input) the current-representative voltage appearing across additional coil 37 (to be described later) through resistor 39. Input 38 is compared with, in a preferred embodiment, a 1.6V reference 56 in comparator 55. The output of comparator 55 is a high/low difference-representative signal 54 fed to multiplier latch 53. The multiplier latch 53 also receives a voltage signal input 36 from the inductor current sensor 35. The multiplier latch 53 ensures that a single pulse appears at the drive output during a given cycle. Multiplier latch 53 will therefore produce the high or low logic level drive output for controlling MOSFET transistor 33 an or off thereby effectively controlling output 28 of flyback power converter 17.

Still referring to FIG. 1, the power converter 17 comprises an inductor device 30 having a core 29, and a coil 27 supplied with full-wave rectified voltage and current from the rectifier bridge 1 5. A second multi-tap coil 28 is wound onto the core 29 of the inductor device 30, The coils 27 and 28 act as primary and secondary windings, respectively, of a transformer. Rectified voltage and current applied to the coil 27 will induce in the coil 28 rectified voltage and current transmitted to a capacitor 31 through a diode 32. Electrical energy is stored in the capacitor 31 to convert the full-wave rectified voltage and current induced in the coil 28 to dc voltage and current supplied to the output 26 of the power converter 17 and therefore to the set 2 of light-emitting diodes 3. Diode 32 prevents return of the electrical energy stored in the capacitor 31 toward the coil 28. The level of the dc voltage across the capacitor 31 and therefore the level of the LED supply dc voltage on the output 25 is adjusted by selecting the appropriate number of LEDs in series on subset 4 and varies with the type of LEDs as well as with temperature.

Supply of coil 27 of the inductor device 30 is controlled by an output 34 of the controller 19 through the above mentioned MOSFET power transistor 33. The current supplying the coil 27 is converted to a voltage signal by the inductor current sensor 35 connected between MOSFET transistor 33 and the ground. The inductor current sensor 35 comprises an output 55 for supplying the voltage signal to an input 36 of the controller 19, and therefore to the multiplier latch 53.

The current through the coil 27 is also measured through the additional coil 37 also wound on the core 29 of the inductor 30. The current-repreentative voltage appearing across the additional coil 37 is supplied, as mentioned hereinabove, to the input 38 of the controller 19 through the resistor 39 and therefore to the comparator 55.

The additional coil 37 is also connected to an accumulator 42. formed by a capacitor 40, through a diode 41. The function of the accumulator 42 is to supply an input 43 of the controller 19 with a dc voltage amplitude higher than a minimum voltage reference to enable operation of the controller 19. The capacitor 40 is charged through a branch switching device 45 and a resistor 46.

Input reference current sensor 51 is responsive to the full-wave rectified voltage at the output of the rectifier bridge 15 to supply on its output 52 the reference control voltage supplied to the multiplier 49 of the controller 19.

Upon switching the LED lamp 1 on, the capacitor 40 is discharged. In response to the full-wave rectified voltage which then appears at the output of the rectifier bridge 15, the branch switching device 45 closes to allow the full-wave rectified voltage from the rectifier bridge 15 to charge the capacitor 40 through the resistor 46 until the voltage across the capacitor 40 exceeds the minimum voltage reference required to operate the controller 19.

Conduction of the MOSFET transistor 33 causes a current to flow through the sensor 35 which then produces on its output 55 a current signal applied to the multiplier latch 53. Conduction of the MOSFET transistor 33 also causes current supply to the act 2 of light-emitting diodes 3 as described in the foregoing description, and to the current sensor circuit 10 to produce an input current feedback signal 24 supplied to controller 19 through the filter circuit 20.

It should be mentioned that since the reference control voltage is supplied to the multiplier 49 by the input reference current sensor 51 in response to the full-wave rectified signal from the rectifier bridge 15, the amplitude of this reference control voltage and therefore the gain of the multiplier 49 varies with the amplitude of the full-wave rectified voltage.

It should also be understood that every time the voltage signal from the inductor current sensor 35, supplied to the multiplier latch 53, exceeds the amplitude of the signal 50 from the multiplier 49, the output of multiplier latch 53 (drive output) then passes from a high logic level to a low logic level to turn the MOSFET transistor 33 off, to thereby prevent that the dc current through the set 3 of light-emitting diodes 3 exceeds a safe level.

Those of ordinary skill in the art will appreciate that the current flowing though the MOSFET transistor 33 is proportional to the full-wave rectified voltage at the output of the rectifier bridge 15. The current waveform is sinusoidal and in phase with the voltage waveform so that the power factor is, if not equal to, close to unity. To further smoothen the current waveform and withdraw the MOSFET switching high frequencies therefrom, an EMI filter 44 can be added, as mentioned in the foregoing description, between the ac source 14 and the full-wave rectifier bridge 15.

To draw current from the ac source 14 throughout every cycle of the sinusoid, the supply voltage at the output 26 of the power converter 17, i.e., the dc voltage across the capacitor 31, must have an amplitude higher than the peak amplitude of the sinusoidal voltage of the ac source 14. To enable reduction of the amplitude of the dc voltage across capacitor 31 to a value lower than the peak amplitude of the sinusoidal voltage of the ac source 14, the key element of the "Boost" type topology of FIG. 1, i.e., the inductor 30, has been modified. More specifically, the second multi-tap coil 28 has been wound onto the core 29. The coils 27 and 28 act as the primary and secondary windings, respectively, of a transformer, and each tap 100 corresponds to a given level of the de voltage on the output 26 of the power converter 17, each given level being of course lower in amplitude than the peak sinusoidal voltage of the ac source. Also, the number of turns associated to the different taps 100 of the coil 28 has been evaluated in relation to the number of turns of the coil 27 of the inductor 30 in order to produce transformation ratios as accurate as possible such that, irrespective of which tap 100 is used to obtain a given output voltage level, the controller 19 will behave in the same manner as when the do voltage at the output 26 of the power converter 17 is fixed and higher than the peak amplitude of the ac input voltage.

Operation of the power factor controller 19 manufactured and commercialized by Motorola under the reference MC33262 is believed to be otherwise well know to those of ordinary skill in the art and, accordingly, Will not be further described in the present specification. Of course, it is within the scope of the present invention to use another type of feedback controller.

Although the present invention has been described hereinabove by way of a preferred embodiment thereof, this embodiment can be modified at will, within the scope of the appended claims, without departing from the spirit and nature of the subject invention.

What is claimed is:

1. A sensor circuit for detecting a current supplied to a non-linear light-emitting load and for producing a voltage signal dependent on a temperature of operation of the light-emitting load, said sensor circuit comprising:
   c) first and second serially interconnected resistors also connected in series with the light-emitting load; and
   d) a variable impedance connected in parallel with one of said first and second resistors, said variable impedance having an impedance value which varies with the temperature of operation of the light-emitting load;
   whereby at least a portion of the current through the light-emitting load flows through the sensor circuit to enable said first and second serially interconnected resistors and said variable impedance to produce a variable voltage signal representative of the current flowing through the light-emitting load and dependent on said temperature of operation.

2. A light source as defined in claim 1, wherein the light-emitting load comprises a set of light-emitting diodes.

* * * * *